(12) United States Patent
Tiew et al.

(10) Patent No.: US 7,560,972 B1
(45) Date of Patent: Jul. 14, 2009

(54) METHODS AND APPARATUS TO REDUCE PROPAGATION DELAY OF CIRCUITS

(75) Inventors: Kee Chee Tiew, Richardson, TX (US); Brett Smith, McKinney, TX (US); Abidur Rahman, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/021,939

(22) Filed: Jan. 29, 2008

(51) Int. Cl.
*H03L 5/00* (2006.01)
(52) U.S. Cl. .......................................... 327/333; 326/81
(58) Field of Classification Search ............. 326/62–63, 326/80–81; 327/306, 333
See application file for complete search history.

(56) References Cited

U.S. PATENT DOCUMENTS

| | | | |
|---|---|---|---|
| 5,465,069 A | 11/1995 | Boiron | |
| 5,666,070 A | 9/1997 | Merritt | |
| 5,834,948 A | 11/1998 | Yoshizaki | |
| 6,268,755 B1 | 7/2001 | Summerlin | |
| 6,384,808 B2 | 5/2002 | Azami | |
| 6,768,368 B2 * | 7/2004 | Kaneko et al. | 327/333 |
| 7,196,574 B1 * | 3/2007 | Vishinsky | 327/557 |
| 7,215,146 B2 * | 5/2007 | Khan | 326/83 |

* cited by examiner

*Primary Examiner*—Dinh T. Le
(74) *Attorney, Agent, or Firm*—William B. Kempler; Wade J. Brady, III; Frederick J. Telecky, Jr.

(57) ABSTRACT

Methods and apparatus to reduce propagation delay of circuits are disclosed. A disclosed apparatus to reduce propagation delay of a circuit comprises a level shifter to selectively turn a first circuit on and off; a first switch to couple the first circuit to a second circuit when the first circuit is on, wherein the second circuit is to selectively receive a first current from the first circuit based on a signal the second circuit receives from the level shifter; and a second switch to couple the first circuit to a reference signal based on the first current, the second switch causing the first circuit to start to turn off.

27 Claims, 2 Drawing Sheets

US 7,560,972 B1

METHODS AND APPARATUS TO REDUCE PROPAGATION DELAY OF CIRCUITS

FIELD OF THE DISCLOSURE

The present disclosure relates generally to circuits and, more particularly, to methods and apparatus to reduce propagation delay of circuits.

BACKGROUND

In electronics devices, low power circuits often interface with high power devices, such as voltage regulators, amplifiers, and so forth. However, such low power circuits may not be able to directly interface with the high power devices. Thus, a level shifter, which converts a signal from the low power device from a first voltage (e.g., 3.3 volts) to a second voltage (e.g., 30 volts), may be included to interface a low power circuit with a high power device. For example, a low voltage from digital logic (e.g., 3.3 volts) must be level shifted to a larger voltage (e.g., 30 volts) to drive a power transistor of a power device.

DETAILED DESCRIPTION

Example methods and apparatus to reduce propagation delay of circuits are disclosed herein. Although the example methods and apparatus described herein generally relate to power transistors, the disclosure is not limited to power transistors. On the contrary, the teachings of this disclosure may be applied in any device which would benefit from circuitry that selectively extracts energy from a circuit element such as a semiconductor device, for example.

Figure 1:
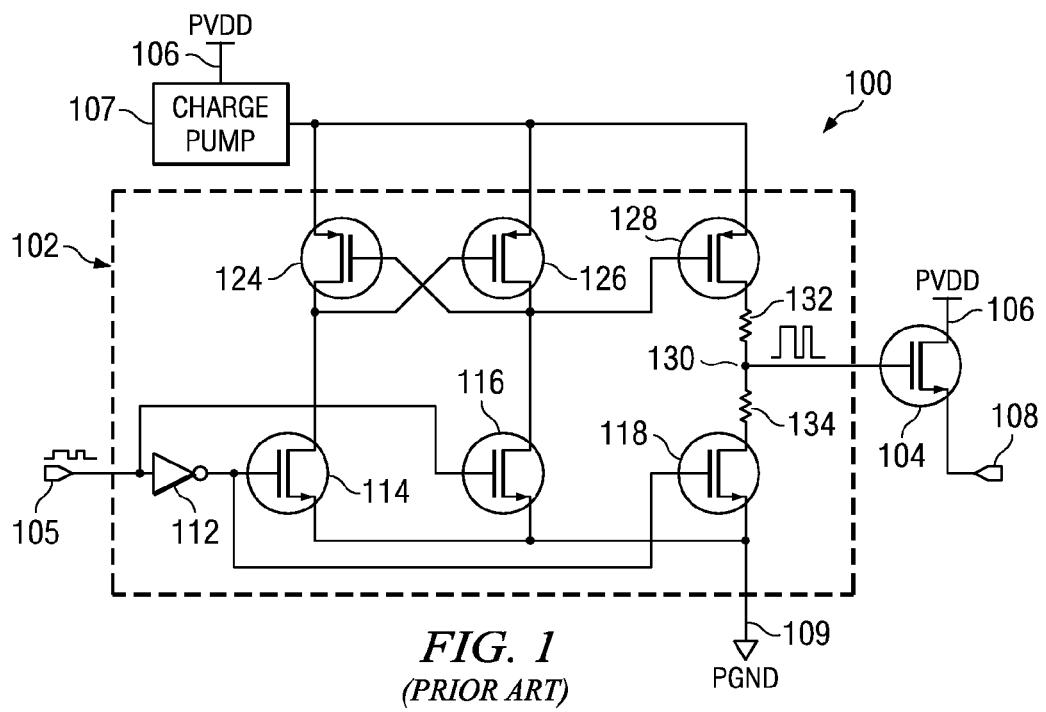
FIG. 1 is a schematic diagram of a circuit to interface a low power circuit with a high power circuit.

FIG. 1 is a schematic diagram of a circuit 100 to interface low power circuits with a high power circuit. In particular, FIG. 1 includes a level shifter 102 that is coupled to a high power transistor 104, which is configured to handle large amounts of power. As a result, the power transistor 104 must be physically large enough to allow the large amounts of current to flow from its drain to its source. As a result of its size, the power transistor 104 typically has large parasitic gate-source and gate-drain capacitances. Generally, these parasitic capacitances are often referred to as the gate charge QG, which is the amount of gate charge required to turn on the power transistor 104 with the least amount of drain-source resistance.

The level shifter 102 receives an input signal via an input 105 indicative of an operating condition of the power transistor 104 (e.g., on, off, etc.). If the level shifter 102 receives a signal indicative of a logic high from the input 105 (e.g., 3.0 volts), the power transistor 104 is to be in an on condition and the level shifter 102 outputs a high voltage (e.g., 30 volts, 42 volts, etc.) that is received by the gate of the power transistor 104. However, in the event that the level shifter 102 receives a signal indicative of a logic low (e.g., zero volts), the power transistor 104 is to be in an off condition and the level shifter 102 conveys a low voltage (e.g., zero volts) to turn off the power transistor 104.

Immediately turning off the power transistor 104 to thereby have no propagation delay is generally desired. However, immediately turning the power transistor 104 on or off causes signals to have sharp edges, which leads to undesired effects such as electromagnetic interference to be emitted by the power transistor 104. Thus, the level shifter 102 is configured to control a slew rate of the power transistor 104, which is the rate at which a voltage of the power transistor 104 increases or decreases. To control the slew rate, the level shifter 102 includes a first resistor 132 and a second resistor 134.

In FIG. 1, the drain of the power transistor 104 is coupled to a power source 106 $P_{VDD}$ and the source of the power transistor 104 is coupled to an output 108 (e.g., a load, an antenna, etc.). As described above, the level shifter 102 selectively actuates the power transistor 104 and allows current to flow through the power transistor 104 (i.e., from its drain to its source) based on the voltage the level shifter 102 applies to the gate of the power transistor 104. That is, the level shifter 102 selectively allows current to flow to the output 108 in response to the voltage at the input 105.

Figure 2:
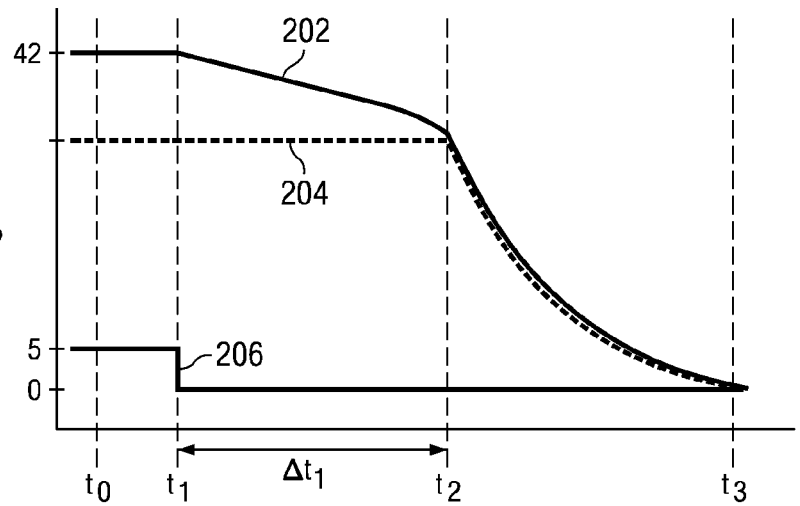
FIG. 2 illustrates the gate and source voltages of the power transistor of FIG. 1 when the power transistor is turning off.

FIG. 2 illustrates a graph of the gate and source voltage of the power transistor 104, which are represented by reference numerals 202 and 204, respectively. In FIG. 2, the voltage at the input 105 with respect to time is represented by reference numeral 206. At time to, the voltage at the input 105 is a logic high voltage and gate voltage of the power transistor 104 is substantially equal to the voltage of the charge pump 107. At time $t_1$, the voltage at the input 105 falls to a logic low voltage. However, as described above, the gate voltage of the transistor 104 (line 204) does not immediately reach a logic low level at time $t_1$ due to its stored charge. As a result, the source voltage of the power transistor 104 (line 202) does not immediately change at time $t_1$ because the power transistor 104 is still turned on.

In particular, because the gate voltage of the power transistor 104 exceeds the voltage at both its drain and its source, its associated parasitic capacitances are large. A pull down path of the level shifter 102, which is implemented by a transistor 118 and the resistor 134, is configured to turn off the power transistor 104 gently to prevent it from conveying sharp falling edges. Preferably, the power transistor 104 will start to turn off immediately at time $t_1$. However, the pull-down path of the level shifter 102 has time constant based on the resistance of the resistor 134 and the parasitic capacitances of the power transistor 104. As a result of the time constant, the level shifter 102 pulls current from the gate of the power transistor 104, thereby removing the stored charge and reducing the gate voltage of the power transistor 104. At time $t_2$, the pull down path of the level shifter 102 has substantially removed the gate charge of the power transistor 104 and, as a result, its gate voltage (line 204) is substantially equal its drain voltage (e.g., within one volt). Thus, the circuit 100 begins to turn off the power transistor 104 after a delay illustrated by the time $\Delta t_1$. The delay illustrated by the time $\Delta t_1$ is approximately 1 microsecond. In other words, the pull down path that gently turns off the power transistor 104 also delays turning off the power transistor 104 due to its stored gate charge.

At time $t_2$, because the voltage of the gate, drain, and source of the power transistor 304 are substantially equal, the stored charge in the parasitic capacitances of the power transistor 104 is reduced. As a result, the pull-down path formed by the resistor 134 and the transistor 118 gently pulls the down the voltage at the gate to turn the power transistor 104 off at time $t_3$. Thus, the circuit 100 of FIG. 1 has a propagation delay, which is the time period between an event that triggers an operating condition transition (e.g., a transition from on to off) and the completion of the triggered transition. In other words, the propagation delay is the time the power transistor 104 takes to transition from a first operating condition (e.g., on) to a second operating condition (e.g., off) in response to an event. In particular, the propagation delay, which is illustrated by the time range $t_1$-$t_3$, is based on the delay in turning off the transistor 104 illustrated by time $\Delta t_1$ and the slew rate of the circuit 100. Thus, the propagation delay increases as a result of the parasitic capacitances that store charge in the gate of the power transistor 104.

Figure 3:
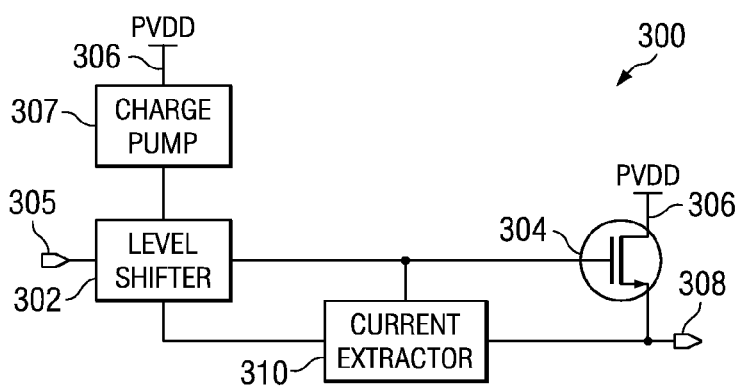
FIG. 3 illustrates a block diagram of an example circuit to interface a low power circuit with a high power circuit.

FIG. 3 illustrates a block diagram of an example circuit 300 to interface a low power circuit with, for example, a high power circuit. The example of FIG. 3 includes a level shifter 302 to actuate a power transistor 304. The level shifter 302 receives an input signal via an input 305, the input signal being indicative of an operating condition of the power transistor 304 (e.g., on, off, etc.). If the level shifter 302 receives a logic high voltage that exceeds a predetermined threshold voltage (e.g., 3.0 volts), the power transistor 304 is to be in an on condition and the level shifter 302 conveys a high voltage (e.g., 42 volts) to the gate of the power transistor. However, when the level shifter 302 receives a logic low voltage that does not exceed the predetermined threshold voltage, then the power transistor 304 is to be in an off condition and the level shifter conveys a low voltage (e.g., zero volts) to the gate of the power transistor 304 to turn it off. In addition, in the illustrated example, the level shifter 302 is coupled to a power source $P_{VDD}$ 306 via a charge pump 307, which increases the voltage of the power source 306 from a first voltage (e.g., 30 volts) to a second voltage that exceeds the first voltage (e.g., 42 volts). In the illustrated example, if the gate voltage of the power transistor 304 exceeds its drain voltage, the power transistor 304 experiences a lower drain-source resistance and, thus, increases the efficiency of the power transistor 304.

The drain of the power transistor 304 is coupled to the power source 306 and the source of the power transistor 304 is coupled to, for example, an output 308 (e.g., a load, an antenna, etc.). In the example of FIG. 3, the level shifter 302 selectively actuates the power transistor 304 and allows current to flow through the power transistor 304 (i.e., from its drain to its source) based on its gate-source voltage of the power transistor 304

In addition, the gate of the power transistor 304 is coupled to a current extractor 310, which selectively extracts current from the power transistor 304 to reduce a propagation delay associated with turning the power transistor 304 off via the level shifter 302. The current extractor 310 is also coupled to the level shifter 302 to receive a signal indicative of an operating condition (e.g., on, off, etc.) of the power transistor 304. In particular, when the power transistor is to be in the off condition, the level shifter 302 conveys a signal that actuates the current extractor 310, causing the current extractor 310 to remove stored charge from the power transistor 304 in the form of a current. In response, the current extractor 310 reduces the propagation delay of the example circuit 300. As will be described below, the current extractor 310 is coupled to the output 308 to copy the gate-source voltage of the power transistor 304.

Figure 4:
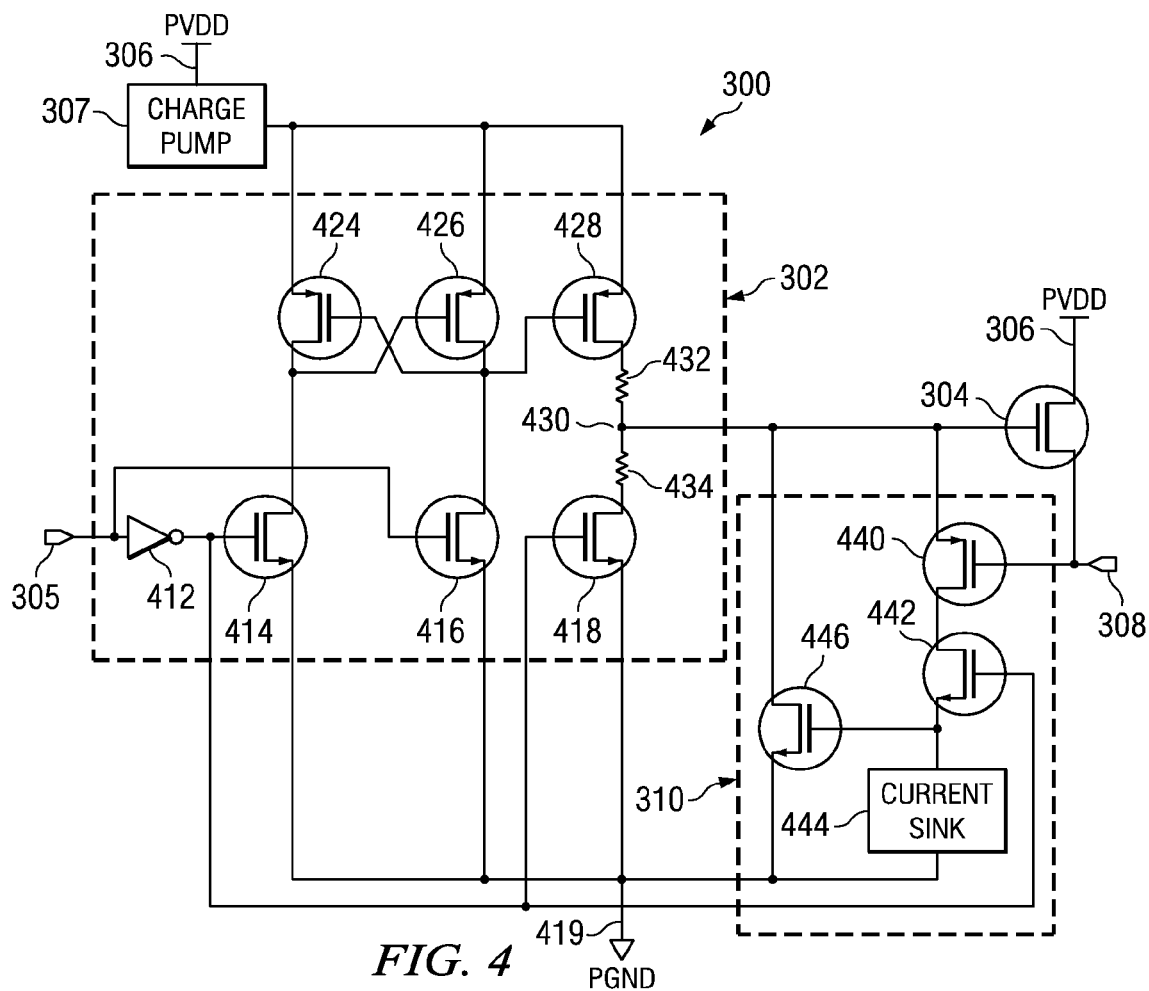
FIG. 4 is a schematic diagram of an example implementation of the circuit of FIG. 3.

FIG. 4 is a schematic diagram of the example circuit 300 illustrating an example implementation of the level shifter 302 and the current extractor 310 in more detail. In the example of FIG. 4, the level shifter 302 receives a signal from the input 305 via an inverter 412 and a transistor 416. The inverter 412 is any logic device that inverts the signal from a logic high voltage (e.g., 3.3 volts) to a logic low voltage (e.g., 0 volts), and vice-versa. The inverter 412 is further coupled to transistor 414 and 418, both of which receive the inverted input signal via their respective gates. The sources of the transistors 414, 416, and 418 are coupled to a reference signal 419 (e.g., a ground, etc.). In addition, the transistors 414, 416, and 418 are implemented by any suitable device such as, for example, NMOS transistors that have substantially equal device characteristics (e.g., doping profile, width-to-length ratios, etc.).

The gate of the transistor 414 also receives the input signal via the input 305. In the illustrated example, the drain of the transistor 414 is coupled to the drain of a transistor 424 and the drain of transistor 416 is also coupled to the drain of a transistor 426. As illustrated in the example of FIG. 1, the gate of the transistor 426 is coupled to the drain of the transistor 424 and the gate of the transistor 424 is coupled to the drain of the transistor 426. In other words, the transistors 424 and 426 are cross-coupled. The sources of both transistors 424 and 426 are coupled to the charge pump 307. In the example of FIG. 4, the transistors 424 and 426 are implemented by any suitable device such, for example, PMOS transistors that are matched.

Another transistor 428 that is implemented by a P-channel MOSFET transistor is coupled to the charge pump 307 via its source. The gate of the transistor 428 is coupled to both the drain of the transistor 426 and the gate of transistor 424. In the illustrated example, the drain of transistor 428 is coupled to a node 430 via a resistor 432. The drain of transistor 418 is also coupled to the node 430 via a resistor 434. The node 430 forms the output of the level shifter 302 and, thus, is coupled to the gate of the power transistor 304. The drain of the power transistor 304 is coupled to the power source 306 and the source of the power transistor 304 is coupled to the output 308.

In the example of FIG. 4, the current extractor 310 includes a switch 440 implemented by a PMOS transistor 440, for example. The transistor 440 is configured to have a gate-source voltage substantially opposite of the gate-source voltage of the power transistor 304. Thus, the gate and the source of the transistor 440 are coupled to the source and the gate of the power transistor 304, respectively. The drain of the transistor 440 is coupled to a drain switch 442, which is implemented by an NMOS transistor 442, for example. In particular, the drain of the transistor 442 is coupled to the drain of the transistor 440. In the illustrated example, the gate of the transistor 442 receives a signal from the level shifter 302 that is indicative of the operating condition of the power transistor 304.

The source of the transistor 442 is coupled to the reference signal 419 via a current sink 444. The current sink 444 may be implemented by any suitable device to a sink predetermined threshold of current. For example, the current sink 444 may be configured by a programmable current source, a voltage-controlled current source such as an NMOS transistor coupled to a voltage reference, and so forth. In some examples, the current sink 444 may be implemented by a circuit element such as a resistor, for example.

The current extractor 310 also includes a switch 446 to selectively couple the gate of the power transistor 304 to the reference signal 419 based on the current flowing through the current sink 444. In the illustrated example, the switch 446 is implemented by an NMOS transistor 446, for example. Thus, the gate of the transistor 446 is coupled to the source of the transistor 442 and the source of the transistor 446 is coupled to the reference signal 419. As a result, the gate-source voltage of the transistor 446 is substantially equal to the voltage across the current sink 444. The drain of the transistor 446 is coupled to the gate of the power transistor 304 to removed stored charge based on the voltage of the current sink 444.

In the operation of the level shifter 302 of FIG. 3, when the input 305 receives a logic high voltage (e.g., 3.3 volts), the inverter 412 converts the logic high voltage into the logic low voltage (e.g., zero volts). The logic low voltage is received by the gates of transistors 414 and 418. In response to the logic low voltage, the transistors 414 and 418 are turned off and current cannot flow into their respective drains. As a result, current cannot flow across the transistor 424, causing its drain-source voltage to be substantially equal to zero volts. In the illustrated example, the gate-source voltage of the transistor 426 is substantially equal to the drain-source voltage of the transistor 424, which causes the transistor 426 to be turned off.

At the same time, the transistor 416 is turned on due to the logic high voltage applied to its gate, thereby allowing current to flow from its drain into the reference signal 419. As a result, the transistor 424 has a gate-source voltage and is turned on. The gate-source voltage of the transistor 428 is substantially equal to the gate-source voltage of transistor 424 and is also turned on.

Thus, in the illustrated example, when the input 305 receives a logic high voltage, the transistor 428 turns on and lets current flow into the gate of the power transistor 304 via the resistor 432 because the transistor 418 is turned off. The current flowing into the power transistor 304 charges its associated parasitic gate-source and gate-drain capacitances. Generally, the parasitic capacitances are referred to as the gate charge QG, which is the charge accumulated at the gate of the power FET when turned on to conduct current with the least resistive losses (i.e., the power transistor 304 is in the ohmic region). Once the parasitic capacitances of the power transistor 304 are charged and it is fully turned on, substantially no current flows via transistor 428. Thus, the voltage at the gate of the transistor 304 is substantially equal to the voltage of the charge pump 307 when the level shifter 302 receives a logic high voltage and the power transistor 304 is fully turned on.

When the level shifter 302 receives a logic low voltage (e.g., zero volts), the low voltage causes the transistor 416 to turn off. In response, because no current can flow into the drain of the transistor 416, the gate-source voltages of transistors 424 and 428 are substantially equal to zero volts and both transistors are 424 and 428 turned off. At the same time, the inverter 412 conveys a logic high voltage to the gates of transistors 414 and 418, turning both on. In response to turning on the transistor 414, the transistor 426 turns on.

Thus, the transistor 418 is turned on and attempts to draw current via the power transistor 304 because the transistor 428 is turned off. The power transistor 304 continues to have a gate-source voltage as a result of the charged stored in the gate due to its associated parasitic capacitances. Thus, the transistor 418 and the resistor 434 form a pull-down path to pull current out of the power transistor 304.

At the same time, when the inverter 412 receives a logic low voltage via the input 305, it conveys a logic high voltage to the transistor 442. In response, the transistor 442 turns on to allow current to flow from its drain to its source. As described above, the gate-source voltage of the transistor 440 is substantially opposite of the voltage of the gate-source voltage of the power transistor 304 and, thus, is turned on. Thus, both transistors 440 and 442 are both turned on and, as a result, the power transistor 304 can provide current to the current sink 444 via the transistors 440 and 442. However, the current sink 444 limits the current flowing via transistors 440 and 442. In particular, in the event the current flowing through the current sink 444 exceeds a predetermined threshold, the voltage across the current sink 444 will be a high voltage. However, in the event that the current flowing through the current sink 444 does not exceed the threshold voltage, the voltage across the current sink 444 will be a low voltage.

In the illustrated example, when the voltage across current sink 444 is a high voltage, the transistor 446 turns on and allows current to flow from its drain to its source. As a result, the transistor 446 couples the gate of the power transistor 304 to the reference signal 419 via a low impedance path formed by the transistor 446, which allows the stored charge in the power transistor 304 to dissipate through the transistor 446 as a current. In other words, the transistor 446 electrically couples the gate of the power transistor 406 to the reference signal 419 via a low impedance path when the transistor 446 is turned on, the impedance of the path being based on the drain-source resistance of the transistor 446. Due to low drain-source resistance of the transistor 446, the gate of the power transistor 304 is effectively shorted to the reference signal 419. As the stored charge of the gate of the power transistor 304 decreases, the gate-source voltage of the power transistor 304 decreases and the gate-source voltage of the transistor 440 increases. In other words, as the gate-source voltage of the power transistor 304 decreases, both transistors 304, 440 turn off in response.

Thus, after a period of time, a substantial amount of the stored energy in the power transistor 304 dissipates, which also decreases the current flowing through the current sink 444. When the current provided to the sink 444 falls below the predetermined threshold, the voltage across the current sink 444 decreases to a voltage below the voltage threshold. In response to the voltage of the current sink falling below the predetermined threshold, the transistor 446 substantially turns off, thereby uncoupling the gate of the power transistor 304 from the reference signal 419 by removing the low impedance path across the transistor 446.

In other words, the current extractor 310 removes stored charge from the gate of the power transistor 304 in response to signal indicative of an off condition of the power transistor 304. In particular, the current extractor 310 forms first and seconds paths to the reference signal 419. The first path is formed via the current sink 444 and the transistors 440, 442, both of which control the operation of the second path formed by transistor 446. If the current flowing through the first path exceeds a predetermined threshold, the second path, which is implemented by the transistor 446, forms a low impedance path to remove stored charge in the gate of the power transistor 304. On the other hand, if the current flowing through the first path does not exceed a predetermined threshold, first path causes the second path to form a high impedance path to prevent current from flowing via the second path.

When the transistor 446 turns off, thereby removing the second path to extract current from the power transistor 304, the pull-down path implemented by the transistor 418 and resistor 304 pulls the voltage of the power transistor 304 down. Because the stored charge is substantially removed, the level shifter 302 will start to turn off the power transistor 304. As described above, the pull-down path of the level shifter 302 has a time constant and gradually decreases the voltages of the power transistor 304. As a result, the current extractor 310 reduces the propagation delay associated with turning off the power transistor 304 with, for example, the level shifter 302. At the same time, the current extractor 310 does not substantially affect the slew rate associated with the operation of the level shifter 302 and the power transistor 304.

Figure 5:
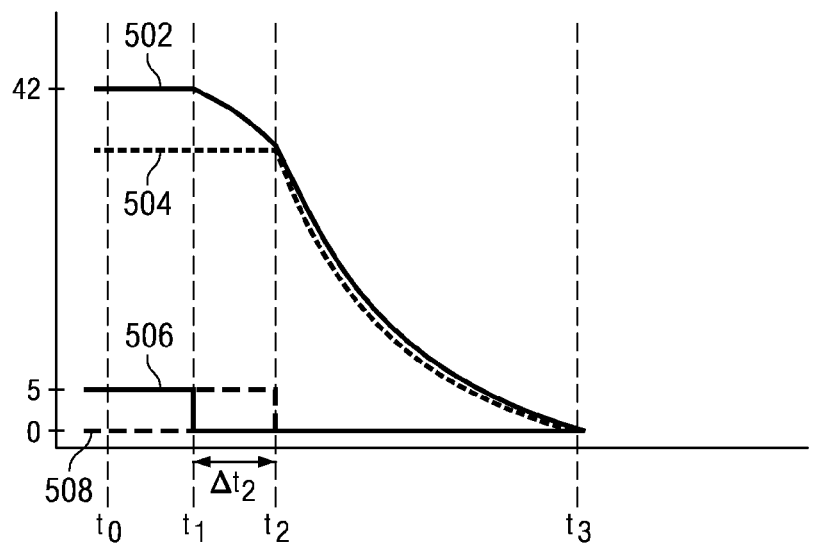
FIG. 5 illustrates the gate and source voltages of the power transistor of FIG. 4 when the power transistor is turning off.

FIG. 5 is an example graph that illustrates the gate and drain voltages of the power transistor 304 with respect to time when the power transistor 304 is turning off. At time to, input signal is a logic high and gate voltage of the power transistor 304, which is represented by reference numeral 502, is substantially equal to the voltage of the charge pump 307. The source voltage of the power transistor 304, which is represented by reference numeral 504, is substantially equal to the voltage of the power source 306. At time $t_1$, the voltage of input signal, which is represented by reference numeral 506, falls to a logic low. As described above, the gate of the power transistor 304 is still charged as has an associated gate voltage.

At time $t_1$, the current extractor 310 receives a logic high from the level shifter 302 and, as described above, couples the power transistor 304 to the reference signal 419 via a low impedance path formed by the transistor 446. At the same time, the resistance of the resistor 434 forms a time constant with the parasitic capacitors of the power transistor 304. However, the low impedance path formed via the current extractor 310 removes the stored charge in the gate of the power transistor 304, thereby decreasing the gate voltage of the power transistor 304. Specifically, at time $t_1$, the current flowing through the current extractor 310 causes the transistor 446 to have a gate-source voltage, which is illustrated by reference numeral 508, and forms the low impedance path from the transistor 304 to the reference signal 419.

At time $t_2$, the charge of the power transistor 304 is substantially reduced and, in response, the gate-source voltage of the transistor 446 falls. Thus, the transistor 446 turns off and forms a high impedance path from the transistor 304 to the reference signal 419. In the illustrated example, the current extractor 310 turns off the transistor 446 when the gate voltage of the power transistor 304 is substantially equal to the voltage of the power source 306 (e.g., within one volt).

Thus, the example circuit 300 experiences a time delay between receiving a signal indicative of the power transistor 304 being in an off condition and the power transistor 304 starting to turn off, which is illustrated by the time $\Delta t_2$. However, the current extractor 310 reduces the delay of the illustrated example to approximately 10 nanoseconds, which is based on the amount of current which the transistor 446 can pass from its drain to its source. In other words, the delay illustrated by $\Delta t_2$ is based on the physical size of the transistor 446. After the current extractor 310 has substantially reduced the charge of the power transistor 304 at time $t_2$, the level shifter 302 begins to pull down the voltage of the power transistor 304 between time $t_2$ and time $t_3$, which is the desired slew rate of the example circuit 300.

Thus, the example circuit 300 has a propagation delay, which is illustrated by the time range $t_1$-$t_3$. In particular, the propagation delay is based on the delay in turning off the power transistor 304 (i.e., time $\Delta t_2$) and the slew rate of the example circuit 300. However, in the illustrated example, the current extractor 310 removes the stored charge from the gate of power transistor 304 to substantially reduce the delay in turning off the power transistor 304. As a result, the operation of the current extractor 310 reduces the propagation delay of the example circuit 300 without substantially affecting its slew rate.

In the described examples, a current extractor substantially reduces a propagation delay by immediately forming a low impedance path to discharge a power transistor when the power transistor 304 is to turn off. A first path includes two switches to selectively form a second path having a low impedance. The first switch electrically couples the power transistor to the second switch based on the gate-source voltage of the power transistor. In response to a signal indicative of an operating condition of the power transistor 304, the second switch electrically couples the gate of the power transistor to a current sink. When the current sink has a predetermined current, the current sink causes a third switch to form the second path having a low impedance, which extracts charge from the gate of the power transistor. In the illustrated example, the current extractor substantially reduces propagation a delay while preserving the slew rate of the example circuit 300. The circuit is easy to implement into any suitable circuit and/or system such as, for example, as a switching amplifier, a power supply, and so forth.

Although certain methods, systems, and articles of manufacture have been described herein, the scope of coverage of this patent is not limited thereto. To the contrary, this patent covers all methods, systems, and articles of manufacture fairly falling within the scope of the appended claims either literally or under the doctrine of equivalents.

What is claimed is:

1. An apparatus to reduce a propagation delay of a circuit, comprising:
   a level shifter to selectively turn a first transistor circuit on and off;
   a first switch to couple the first transistor circuit to a second circuit when the first transistor circuit is on, wherein the second circuit is selectively operated to receive a first current from the first transistor circuit in response to a signal the first switch receives from the level shifter; and
   a second switch to couple the first transistor circuit to a reference voltage based on the first current, the second switch causing the first transistor circuit to start to turn off.

2. An apparatus as defined in claim 1, wherein the second circuit is to start to turn the first transistor circuit off in response to the signal.

3. An apparatus as defined in claim 2, wherein the second switch is to couple the first transistor circuit with the reference voltage at substantially the same time the first transistor circuit is to turn off.

4. An apparatus as defined in claim 3, wherein the second switch is to form a low resistance path to the reference voltage.

5. An apparatus as defined in claim 1, wherein the second circuit comprises a third circuit coupled to the second circuit via a third switch when the first transistor circuit is to turn off.

6. An apparatus as defined in claim 5, wherein the third circuit comprises a current source to define the first current.

7. An apparatus as defined in claim 6, wherein the current source comprises at least one of a resistor, a programmable current source, or a voltage controlled current source.

8. An apparatus as defined in claim 6, wherein the current source is to have a first voltage based on the first current.

9. An apparatus as defined in claim 8, wherein second switch is to couple the first circuit to the reference voltage when the first voltage exceeds a predetermined value.

10. An apparatus as defined in claim 9, wherein second switch is to couple the first circuit to the reference voltage when the predetermined value exceeds the first voltage.

11. A method of turning off a first transistor circuit coupled to a level shifter, comprising:
    coupling the first transistor circuit to a second circuit via a first switch when the first circuit is on;
    selectively receiving a first current in the second circuit via the first transistor circuit in response to receiving a signal via the level shifter;

coupling the first transistor circuit to a reference voltage via a second switch based on the first current, the second switch causing the first transistor circuit to start to turn off; and uncoupling the first transistor circuit from the reference voltage based on the first current.

12. A method as defined in claim 11, wherein coupling the first transistor circuit to the reference voltage comprises providing a low resistance path to start to turn off the first transistor circuit.

13. A method as defined in claim 11, wherein the second circuit is to start to turn the first transistor circuit off in response to the signal.

14. A method as defined in claim 11, wherein selectively receiving a first current in the second circuit via the first transistor circuit in response to receiving a signal from the level shifter comprises:

coupling a third circuit to the first switch in response to the signal; and generating a first voltage in the third circuit in response to receiving the first current.

15. A method as defined in claim 14, wherein the third circuit comprises at least one of a resistor, a current source, a programmable current source, or a voltage-controlled current source.

16. A method as defined in claim 14, wherein coupling the first circuit to a reference voltage via a second switch based on the first current comprises coupling the first circuit to the reference signal via the second switch when the first voltage is greater than a threshold voltage.

17. A method as defined in claim 16, wherein uncoupling the first transistor circuit from the reference signal based on the first current comprises uncoupling the first transistor circuit from the reference voltage via the second switch when the threshold voltage is greater than the first voltage.

18. An apparatus to reduce a propagation delay of a circuit, comprising:

a level shifter to selectively turn a first transistor on and off;

a second transistor to couple the first transistor to a first circuit when the first transistor is on, wherein the first circuit selectively receives a first current from the first transistor in response to a signal the first circuit receives from the level shifter; and a third transistor to couple the first transistor to a reference voltage based on the first current, the third transistor causing the first transistor to start to turn off.

19. An apparatus as defined in claim 18, wherein the first circuit is to start to turn the first transistor off in response to the signal.

20. An apparatus as defined in claim 19, wherein the third transistor is to couple the first transistor to the reference voltage at substantially the same time the first transistor is to turn off.

21. An apparatus as defined in claim 20, wherein the third transistor is to form a low resistance path to the reference voltage.

22. An apparatus as defined in claim 18, wherein the first circuit comprises a fourth transistor to couple a second circuit to the second transistor when the first transistor is to turn off.

23. An apparatus as defined in claim 22, wherein the second circuit comprises a current source.

24. An apparatus as defined in claim 23, wherein the current source comprises at least one of a resistor, a programmable current source, or a voltage controlled current source.

25. An apparatus as defined in claim 24, wherein the current source is to have a first voltage based on the first current.

26. An apparatus as defined in claim 25, wherein third transistor is to couple the first transistor to the reference voltage when the first voltage exceeds a predetermined value.

27. An apparatus as defined in claim 26, wherein third transistor is to couple the first transistor to the reference voltage when the predetermined value exceeds the first voltage.

* * * * *